United States Patent [19]
Sehrig et al.

[11] Patent Number: 5,604,460
[45] Date of Patent: Feb. 18, 1997

[54] AMPLIFIER ARRAY AND RECEIVER CIRCUIT THAT INCLUDES THE AMPLIFIER ARRAY

[75] Inventors: Peter Sehrig, Poecking; Josef Fenk, Eching; Stefan Heinen, Krefeld, all of Germany

[73] Assignee: Siemens Aktiengesellschaft, Munich, Germany

[21] Appl. No.: 500,041

[22] Filed: Jul. 10, 1995

[30] Foreign Application Priority Data

Jul. 8, 1994 [DE] Germany ............... 44 24 140.2

[51] Int. Cl.$^6$ ............................................. H03F 1/14
[52] U.S. Cl. ................................. 330/51; 330/124 R
[58] Field of Search .......................... 330/51, 124 R, 330/129, 254, 278, 295; 455/234.1

[56] References Cited

U.S. PATENT DOCUMENTS

| | | | |
|---|---|---|---|
| 3,603,972 | 9/1971 | Vanderford | 340/347 AD |
| 4,430,609 | 2/1984 | Van Kessel et al. | 323/350 |
| 4,598,252 | 7/1986 | Andricos | 330/51 |
| 5,216,384 | 6/1993 | Vanhecke | 330/279 |
| 5,272,449 | 12/1993 | Izawa | 330/2 |
| 5,313,172 | 5/1994 | Vagher | 330/254 |

FOREIGN PATENT DOCUMENTS

| | | |
|---|---|---|
| 2040125 | 8/1980 | United Kingdom . |
| 1578645 | 11/1980 | United Kingdom . |

*Primary Examiner*—Steven Mottola
*Attorney, Agent, or Firm*—Herbert L. Lerner; Laurence A. Greenberg

[57] ABSTRACT

An amplifier array having digitally adjustable total gain and being constructed of a multiplicity of switchable individual amplifiers, includes at least two parallel, selectively triggerable gain paths having input and output sides. Each of the gain paths has an input amplifier and a switching amplifier being connected downstream of the input amplifier and being switchable in stages. A multiplexer has inputs connected to the output side of the gain paths and has an output. An amplifier array input is connected to the input side of the gain paths and an amplifier array output is formed by the output of the multiplexer. In a mobile radio receiver having the amplifier array, a total gain of the amplifier array is adjusted for setting an output signal of the mobile radio receiver at a constant level.

13 Claims, 6 Drawing Sheets

AMPLIFIER ARRAY AND RECEIVER CIRCUIT THAT INCLUDES THE AMPLIFIER ARRAY

BACKGROUND OF THE INVENTION

Field of the Invention

The invention relates to an amplifier array with digitally adjustable total gain that is constructed of a multiplicity of switchable individual amplifiers, and to a receiver circuit, in particular a mobile radio receiver circuit, with such an amplifier array.

The receiver circuits of mobile radio handsets, for instance, must each be capable, depending on the distance from the base station, of processing variably high levels of a signal to be received, and a prevalent condition is that an output signal of the receiver should have a level that is as constant as possible. The output level should be constant not only over time but also over temperature, and should also have the greatest possible signal-to-noise ratio. Moreover, it should be as independent as possible from operating voltage fluctuations and from production variations. A typical receiver circuit is shown in a block circuit diagram in the paper entitled "An RF Front-End for Digital Mobile Radio" from IEEE 1990, Bipolar Circuits and Technology Meeting, pp. 244 to 247. There, an antenna is supplied through a switch and a first filter to a HF preamplifier that is constructed with a gain regulation input. Its output signal is delivered through a second filter to a first mixer. Its output signal, the intermediate frequency signal, is filtered through the use of a SAW filter and is delivered, through an intermediate frequency (IF) amplifier, to a second mixer, having an output signal which is then the base band signal and can be delivered, for instance, to an A/D converter. The IF amplifier also has an input for regulating its gain. Overall, by regulating the gain of the preamplifier and the IF amplifier, the level of the base band signal can be kept at a virtually constant value, even though the reception signal which is present at the antenna can have major differences in level. The amplifiers are regulated by providing that the resistance of a diode, connected parallel to the load resistor of a given amplifier, is varied through the use of a current source that triggers the diode. However, the disadvantage of that type of analog regulation is that the gain for a predetermined regulated voltage variable has excessive temperature drift, and that the magnitude of that drift depends on the gain value that has just been adjusted. Moreover, the input levels of the differential stages of those amplifiers are limited to 200 mVpp, and the linearity also varies with the status of regulation. Another disadvantage is that the input noise ratio cannot be adjusted to the lowest possible values.

The paper "A 100 MHz IF Amplifier/Quadrature Demodulator for GSM Cellular Radio Mobile Terminals", from IEEE 1990, Bipolar Circuits and Technology Meeting, pp. 248–251, discloses a digital adjustment of the amplifier values of the IF amplifier for a mobile radio receiver. To that end, four amplifiers are connected in series, and they can be switched for gains of between 0 and 24 dB, 0 and 12 dB, 0 and 6 dB, or 0 and 3 dB, respectively. Accordingly, gains between 0 and 45 dB can be established, in increments of 3 dB. However, the disadvantage of that known digital adjustment is that only the smallest possible increment size of 3 dB is provided. Moreover, for a steady increase or decrease in the total gain, individual amplifiers must be repeatedly turned on and off again, which worsens the linearity of the overall configuration.

SUMMARY OF THE INVENTION

It is accordingly an object of the invention to provide an amplifier array and a receiver circuit that includes the amplifier array, which overcome the hereinafore-mentioned disadvantages of the heretofore-known devices of this general type. The amplifier array should have an adjustable gain that is largely independent of temperature and operating voltage fluctuations. Moreover, it should have an equivalent input noise ratio, which at maximum gain is as low as possible, and at the same time it should have a high modulation capacity. The receiver circuit should have an output signal that is independent of fluctuations in its reception signal, temperature and operating voltage, and of production variations.

With the foregoing and other objects in view there is provided, in accordance with the invention, an amplifier array having digitally adjustable total gain and being constructed of a multiplicity of switchable individual amplifiers, comprising at least two parallel, selectively triggerable gain paths having input and output sides; each of the gain paths having an input amplifier and a switching amplifier being connected downstream of the input amplifier and being switchable in stages; a multiplexer having inputs connected to the output side of the gain paths and having an output; and an amplifier array input connected to the input side of the gain paths and an amplifier array output being formed by the output of the multiplexer.

By constructing the amplifier array with at least two parallel, selectively triggerable gain paths, each of which is formed with one input amplifier and one switching amplifier following it that can be switched in stages, where the gain paths are connected on the input side to the input of the amplifier array and on the output side to respective inputs of a multiplexer having an output forming the output of the amplifier array, it is possible to trigger the amplifier array in such a way that, for instance in the event of an incremental drop in the gain, an amplifier need be turned on and off only once any time, so that a virtually linear course is assured. For instance, if there are two gain paths, and the input amplifier of the first path has a gain of 24 dB, the input amplifier of the other path has a gain of 0 dB, and the switching amplifiers can each be switched in 12 stages of 2 dB each between −8 dB and 14 dB, then a linear gain course is obtained if first this switching amplifier of the first path is switched in increments from 14 dB to −8 dB, so that the total gain varies in increments of 2 dB each from 38 dB to 16 dB, and then a switchover to the second gain path is made, having a switching amplifier which is then switched from 14 dB to −8 dB, so that the total gain further varies linearly from 14 dB to −8 dB and thus from a total of 38 dB to −38 dB, yet per increment, only one amplifier at a time needs to be switched.

If the input amplifier of the first path produces the greatest gain and if a further input amplifier is connected to it, then the equivalent input noise ratio can be minimized by making this input amplifier as low-noise as possible.

In accordance with another feature of the invention, it is especially advantageous if the input amplifiers are constructed so as to be switchable, so that the selection of a gain path can be made by the selection of an input amplifier.

In accordance with a further feature of the invention, an especially low signal-to-noise ratio is attained if the input amplifiers are constructed to be base-coupled amplifiers.

In accordance with an added feature of the invention, in order to attain adequate forward transmission damping for the gain path that has been turned off, the switching amplifiers are constructed as emitter-coupled amplifiers.

In accordance with an additional feature of the invention, since the gain of an individual amplifier cannot be made arbitrarily great, the multiplexer is followed by at least one further switching amplifier, and this at least one further switching amplifier should then be switchable in the same width of increments as the switching amplifiers of the gain paths.

In accordance with yet another feature of the invention, the switching amplifiers are formed by a multiplicity of n parallel-connected amplifiers of different gain, which can be turned on selectively. Each of their gains differs by the same factor from the gain of any other amplifier in the same switching amplifier. In order to adjust the gain of a switching amplifier, one of the n parallel-connected amplifiers is selected, while the others are blocked. To that end, the switching amplifier can, for instance, be triggered by an n-bit-wide line, with only one bit at a time ever assuming an active state.

In accordance with yet a further feature of the invention, in order to prevent continuous further amplification of a direct voltage offset, at least one of the two switching amplifiers is coupled capacitively. However, the switching amplifiers can also already be capacitively coupled in the gain paths.

In accordance with yet an added feature of the invention, the amplifiers are constructed as differential amplifiers.

Through the use of a suitable choice of the number of amplifiers, the interconnection of the individual amplifiers to make switching amplifiers, and the width of the increments of the gain, the gain range of the amplifier array can be adjusted.

In accordance with still another feature of the invention, by a suitable choice of the gain ranges of the switching amplifiers and suitable triggering in the amplifier array according to the invention, a linear gain characteristic can be attained, because any individual amplifier needs to be turned on only once. However, it is no disadvantage if upon the switchover from one gain path to another, or in other words the switchover of input amplifiers, individual amplifiers are switched over a second time within one switching amplifier.

In accordance with yet an additional feature of the invention, in order to trigger the individual amplifiers, the amplifier array has a control circuit that furnishes the signals for selecting individual amplifiers.

In accordance with again another feature of the invention, the control circuit is triggered by a three-conductor bus. Then, one of the conductors carries an enable signal, with which the other two conductors can be enabled. Another conductor carries a clock signal, and the third conductor carries a data signal that contains the data for adjusting the amplifier array. Through the use of the clock signal during an active state of the enable signal, these data can then be input, for instance, into a shift register in the control circuit, and from there they are then used either directly, or after recoding, for switching the amplifiers.

In accordance with again a further feature of the invention, in order to achieve high temperature stability, a reference current is generated and operatively connected to the amplifiers through the operating point currents of these amplifiers. Combinations of PTC and NTC resistors, which are acted upon by a bandgap reference voltage, for instance, are preferably used for this purpose.

The amplifier array according to the invention is especially advantageous when used in a receiver circuit, especially a mobile radio receiver circuit, where the total gain primarily of the IF amplifier must be adjusted and regulated in such a way that regardless of the level of the HF input signal, the level of the base band signal will have a virtually constant value, since an A/D converter, for instance, that follows the receiver has only a restricted dynamic range.

With the objects of the invention in view, there is also provided a mobile radio receiver, comprising an amplifier array and an adjuster for a total gain of the amplifier array setting an output signal of the mobile radio receiver at a constant level.

In accordance with another feature of the invention, there is provided a switchable HF preamplifier which can also be triggered by the adjuster or control circuit of the amplifier array, so that the dynamic range of the amplifier array according to the invention, which forms the IF amplifier, can be selected to be smaller.

In accordance with a concomitant feature of the invention, there is provided a three-conductor bus for triggering the total gain adjuster.

Other features which are considered as characteristic for the invention are set forth in the appended claims.

Although the invention is illustrated and described herein as embodied in an amplifier array and a receiver circuit that includes the amplifier array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
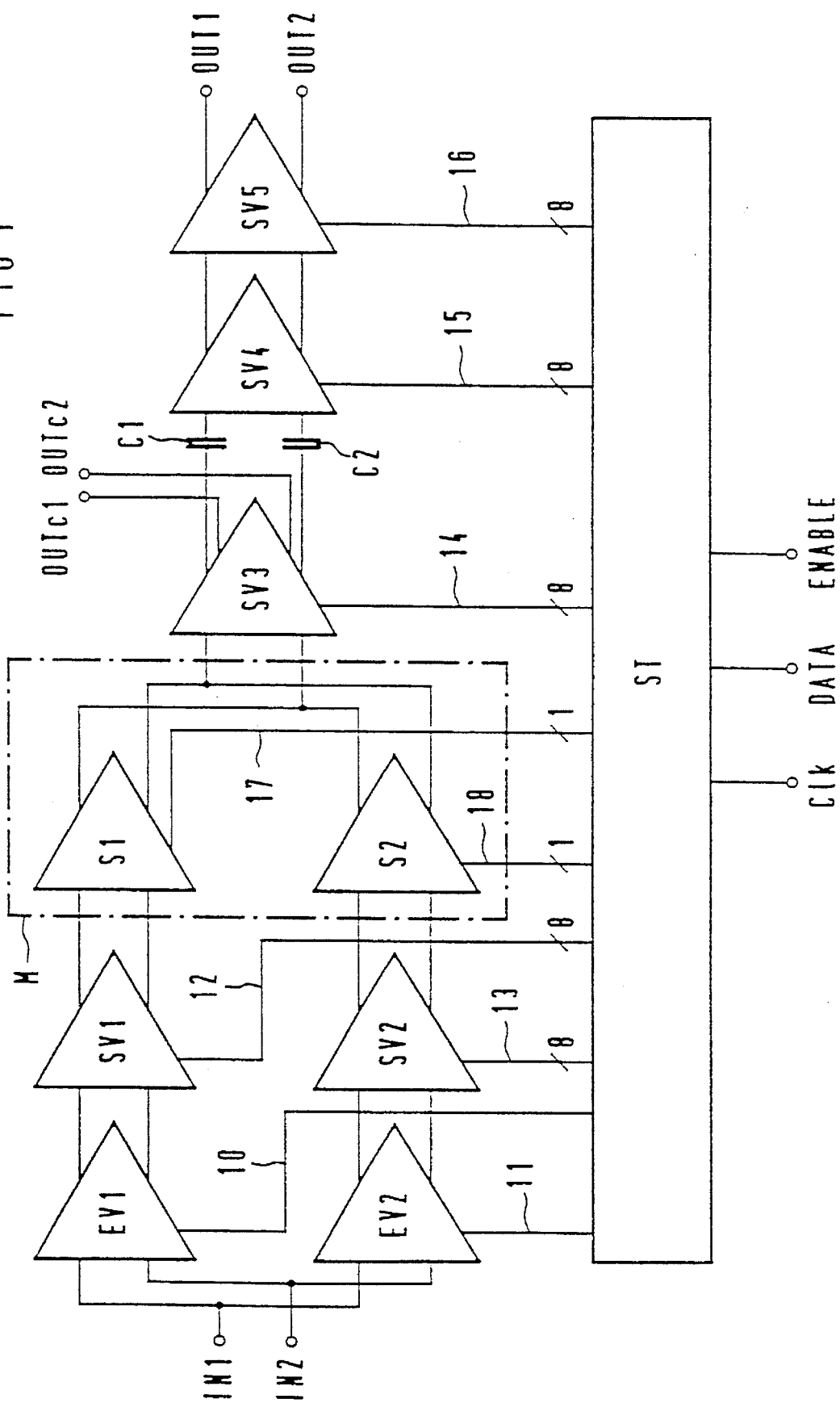
FIG. 1 is an expanded schematic and block circuit diagram of an amplifier array according to the invention.

Referring now to the figures of the drawing in detail and first, particularly, to FIG. 1 thereof, there is seen a schematic and block circuit diagram of an amplifier array according to the invention that has a multiplicity of amplifiers EV1, EV2, SV1, SV2, SV3, SV4 and SV5, all of which are constructed as differential amplifiers and each of which has two inputs and two outputs. Inputs of two gain paths 1 and 2 are connected to two input terminals IN1, IN2 of the amplifier array, wherein reference numerals 1 and 2 in reference symbols IN1 and IN2 indicate the gain paths 1 and 2. Each gain path 1 and 2 includes a respective input amplifier EV1 and EV2 and a respective switching amplifier SV1 and SV2. Outputs of the gain paths 1, 2 are connected to various inputs of a multiplexer M. The multiplexer includes two switches S1 and 2, having outputs which are connected to one another and form an output of the multiplexer M. The output of the multiplexer M could already serve as the output of the amplifier array. For further amplification, however, the multiplexer is followed by three further switching amplifiers SV3, SV4 and SV5. The switching amplifier SV4 is coupled to the switching amplifier SV3 through two capacitors C1 and C2, in order to filter out any direct voltage offset. For that purpose, a different one of the switching amplifiers, or multiple ones of them, could also be capacitively coupled. The output of the last switching amplifier SV5 forms an output OUT1, OUT2 of the amplifier array. Further outputs could also be extended to the outside, for instance for the connection of filter elements to the further outputs, or if a lower total gain is also desired, which is shown in suggested form for outputs outc1 and outc2 of the switching amplifier SV3.

Each of the switching amplifiers SV1 . . . SV5 are constructed with eight parallel-connected individual amplifiers that can be turned on selectively. There may be more than eight individual amplifiers as well. They are each connected to a total gain adjuster for the amplifier in the form of a control circuit ST over an eight-bit-wide line 12 . . . 16. Each line of the eight-bit-wide line is connected to one of the eight parallel-connected individual amplifiers and can activate that amplifier, but at a given time only one of the individual amplifiers of a switching amplifier, is activated. Each individual amplifier has a gain that differs from the gain of each other one of the individual amplifiers of a given switching amplifier. Preferably, the gains of the individual amplifiers are chosen in such a way that by switching onward from one individual amplifier to the next, the gain increases or decreases by a constant factor. In a preferred embodiment of the amplifier array, all of the switching amplifiers SV1 . . . SV5 have the same selectable gains.

The input amplifiers EV1, EV2 are each connected to the control circuit ST through a respective control line 10 and 11 and can be selected thereby. The input amplifiers EV1, EV2 have different gains, so that the two gain paths 1 and 2 also have different gains. The gains of the input amplifiers EV1 and EV2, the gain ranges of the switching amplifiers SV1 . . . SV5, and the increment widths within which the switching amplifiers SV1 . . . SV5 can be switched are chosen in such a way that each individual amplifier of each switching amplifier, for each choice of a gain path 1 or 2, need be switched only once, so as to obtain a linear characteristic curve of the amplifier array.

The multiplexer M is triggered by the control circuit ST through two control lines 17 and 18, each of which is connected to a respective one of the switches S1 and S2. In this way, whichever gain path 1 or 2 has an input amplifier SV1 or SV2 that is just then activated can be switched to the output of the multiplexer M. The control circuit ST has three inputs Clk, DATA and ENABLE, by way of which it can be connected to a three-conductor bus. A signal at the Enable input activates the control circuit ST in such a way that the DATA and the Clk inputs are enabled. These inputs need be enabled only if the amplifier array has to be switched over. If a signal at the ENABLE input has an active state, then data at the DATA input can be clocked into a shift register of the control circuit ST, for instance, through the use of a clock signal at the Clk input. These data can then be used either directly for triggering the amplifiers EV1, EV2, SV1 . . . SV3 and the multiplexer M, or can first be decoded through the use of decoding circuits.

Figure 2:
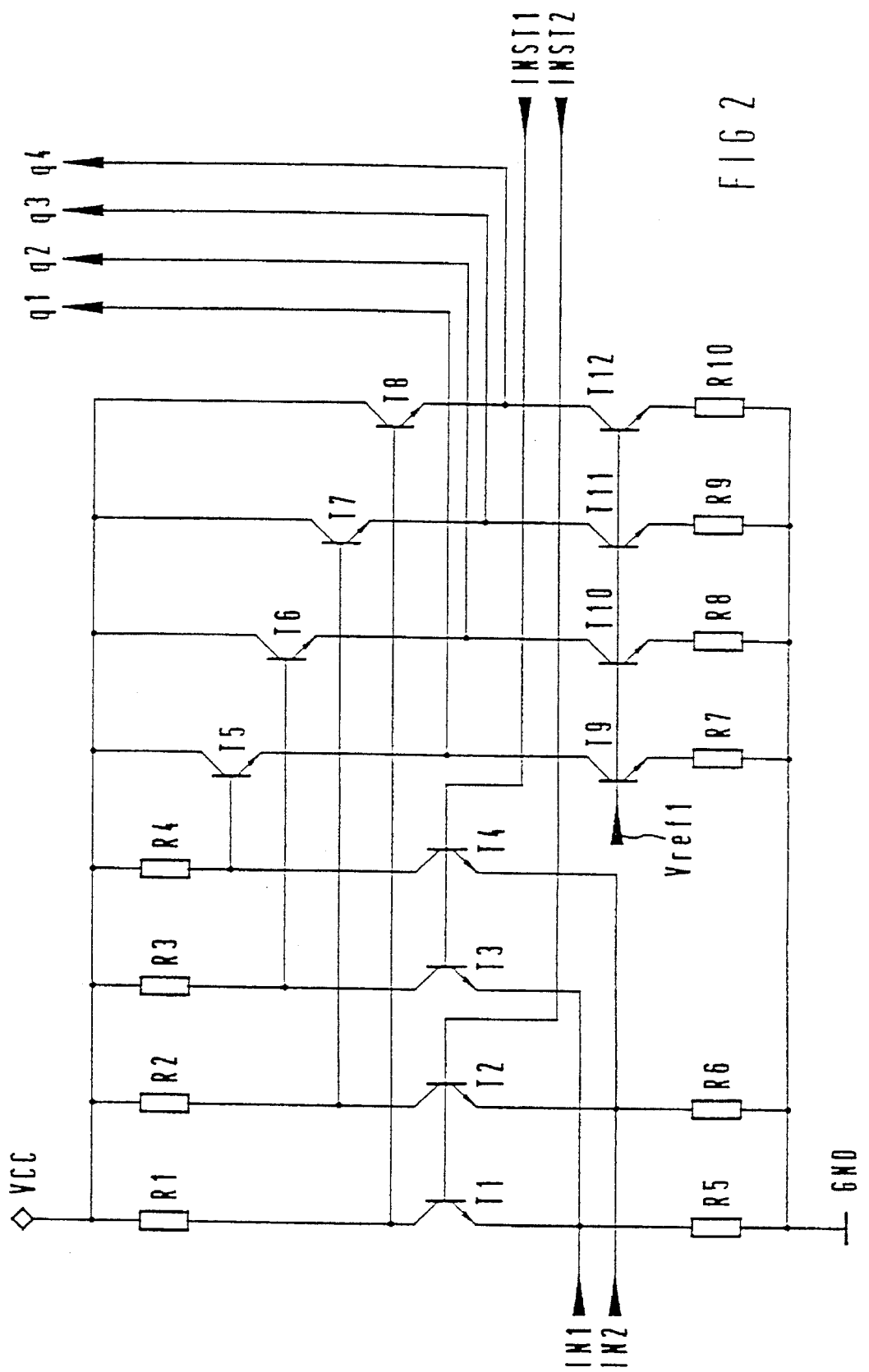
FIG. 2 is a detailed schematic circuit diagram of an input amplifier.

FIG. 2 provides a detailed circuit diagram for one possible embodiment of base-coupled input amplifiers EV1, EV2.

Each of the two input amplifiers EV1 and EV2 is constructed of two transistors T3 and T4 or T1 and T2 having respective emitter terminals which are connected to a reference potential GND through respective resistors R5 and R6. In this way, the emitter terminals of the transistors T3 and T1 are connected to one another and form the first input terminal IN1 of the amplifier array, and the emitter terminals of the transistors T4 and T2 are connected to one another and form the second input terminal IN2 of the amplifier array. Collector terminals of the transistors T1–T4 are each connected to a supply potential VCC through a respective resistor R1, R2, R3 and R4. Base terminals of the transistors T3 and T4 are connected to one another and to a first control terminal INST1. Base terminals of transistors T1 and T2 are also connected both to one another and to a second control terminal INST2. As a result, the transistors T1 and T2 or the transistors T3 and T4 can selectively be made conducting, and thus one of the input transistors EV1 or EV2 and therefore one gain path 1 or 2 can be selected. The differing gain of the two input amplifiers EV1 and EV2 is adjusted through the collector resistors R1 and R2, on one hand, or R3 and R4, on the other hand. The collectors of the transistors are also each connected to base terminals of respective output transistors T5, T6, T7 and T8.

Collector terminals of these output transistors T5–T8 are each connected directly to the supply voltage potential VCC, and emitter terminals thereof are each connected through a series circuit of a collector-to-emitter path of a respective transistor T9, T10, T11 or T12, and a resistor R7, R8, R9 or R10, to the reference potential GND. Base terminals of the transistors T9–T10 are connected to a reference voltage Vref1. The resistors R1–R6 have a positive temperature coefficient, and the resistors R7–R10 have a negative temperature coefficient. The reference voltage Vref1 is derived from a non-illustrated bandgap reference voltage. Through the cooperation of the reference voltage Vref1 and the resistors R1–R10, a high temperature independence of the gain of the input amplifiers EV1 and EV2 is attained. Outputs q1 and q2 on one hand, and q3 and q4 on the other hand, of the respective input amplifiers EV1, EV2, are formed by emitter terminals of the respective output transistors T5 and T6, and T7 and T8.

Figure 3:
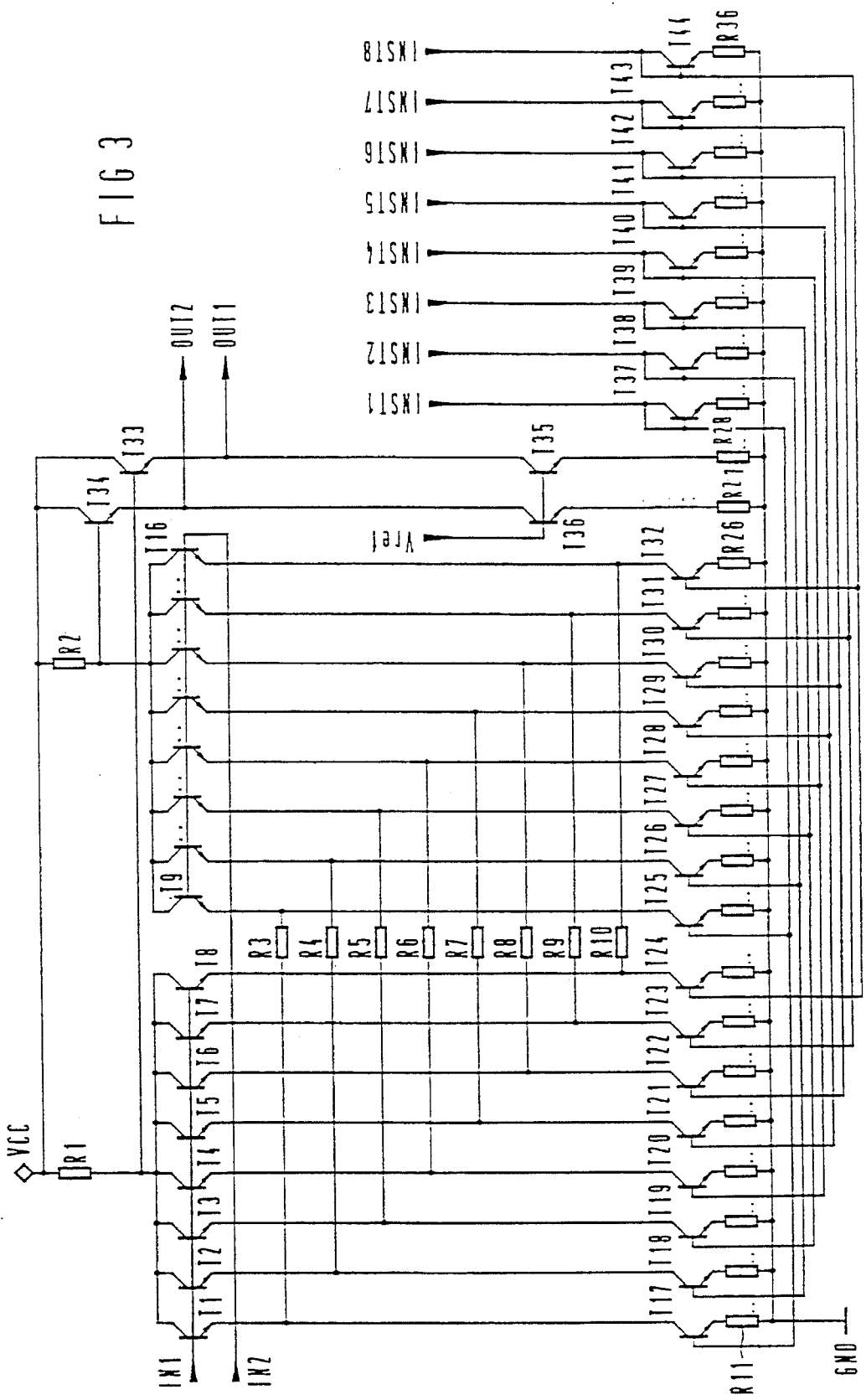
FIG. 3 is a detailed schematic circuit diagram of a switching amplifier with eight individual amplifiers.

FIG. 3 shows a detailed circuit diagram of one possible embodiment of a switching amplifier SV which, by way of example, has eight individual amplifiers, constructed as emitter-coupled differential amplifiers. One such individual amplifier will be described as an example below, using component designations each having a subscript i, wherein i will always range from 1 to 8. An individual amplifier is formed by two transistors $T_i$ and $T_{i+8}$, having emitter terminals which are connected to one another through a resistor $R_{i+2}$ and each being connected to the ground potential GND through a series circuit of respective collector-to-emitter paths of transistors $T_{i+15}$ and $T_{i+24}$ and resistors $R_{i+10}$ and $R_{i+18}$. Collector terminals of the transistors $T_i$ and $T_{i+8}$ are connected to the supply voltage potential VCC through respective resistors R1 and R2.

Base terminals of all of the transistors $T_i$ are connected to the first input terminal IN1, and base terminals of all of the transistors $T_{i+8}$ are connected to the second input terminal IN2. The gain of the various individual amplifiers of one switching amplifier is adjusted through the resistors $R_{i+2}$. The collector terminals of the transistors $T_i$ are connected to a base terminal of a first output transistor T33, and the collector terminals of the transistors $T_{i+8}$ are connected to a base terminal of a second output transistor T34. Collector terminals of the output transistors T33 and T34 are connected to the supply voltage potential VCC. Emitter terminals of the output transistors T33, T34 are each connected to reference potential GND through a series circuit of a collector-to-emitter path of a respective transistor T35 and T36 and a respective resistor R27 and R28, and form the output terminals OUT1 and OUT2 of the switching amplifier. Base terminals of the transistors T35, T36 are connected to a reference potential Vref. This reference potential Vref is derived in a non-illustrated manner from a bandgap reference voltage through the use of one PTC resistor and one NTC resistor. All of the resistors of the switching amplifier shown in FIG. 3 have a negative temperature coefficient and have a stabilizing effect, in terms of the dependency of the amplifiers on temperature, upon an adjustment of the operating point of the output transistors T34, T35 by the reference potential Vref. Base terminals of the transistors $T_{i+16}$ and $T_{i+24}$ are each connected to one another, to a control input $INST_i$, and through a series circuit of a diode $T_{i+36}$, which is polarized in the forward direction, and a resistor $R_{i+28}$, to reference potential GND. Through the application of a high level to one of the control inputs $INST_i$, the individual transistor belonging to that switching amplifier is activated, and its gain then defines the gain of the switching amplifier.

Figure 4:
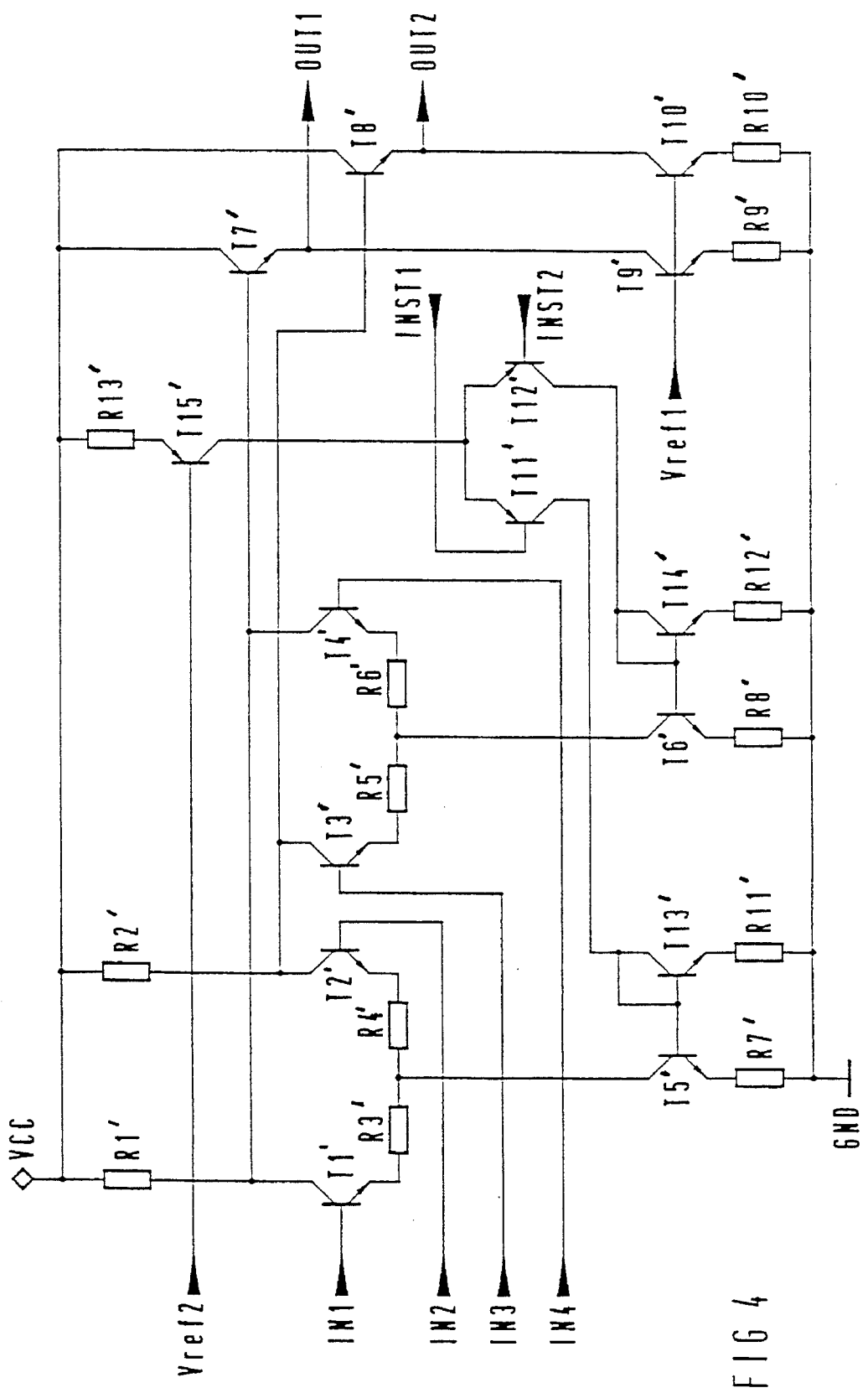
FIG. 4 is a detailed schematic circuit diagram of a multiplexer.

FIG. 4 shows a detailed circuit diagram of one possible embodiment of the multiplexer M, which is formed by the two switches S1 and S2, each of which is formed with differential amplifiers. These differential amplifiers can be activated selectively.

Each differential amplifier is formed by two transistors T1' and T2' on one hand, and T3' and T4' on the other hand, having emitter terminals which are connected to one another through a series circuit of two resistors R3' and R4' on one hand and R5' and R6' on the other hand. Junctions of the various resistors R3', R4' and R5', R6' are each connected to reference potential GND through a series circuit of a collector-to-emitter path of a respective transistor T5' and T6' and a respective resistor R7' and R8'. Collector terminals of the transistors T1' and T4' are connected to the supply voltage potential VCC through a resistor R1', and collector terminals of the transistors T2' and T3' are connected to the supply voltage potential VCC through a resistor R2'. A base terminal of the transistor T1' is connected to a first input terminal IN1, a base terminal of transistor T2' is connected to a second input terminal IN2, a base terminal of the transistor T3' is connected to a third input terminal IN3, and a base terminal of transistor T4' is connected to a fourth input terminal IN4 of the multiplexer M. The collector terminals of transistors T1' and T4' are also connected to a base terminal of a first output transistor T7', and the collector terminals of the transistors T2' and T3' are also connected to a base terminal of a second output transistor T8'. Collector terminals of the output transistors are connected directly to the supply voltage potential VCC. Emitter terminals of the output transistors T7', T8' are each connected to the reference potential terminal GND through a series circuit of a collector-to-emitter path of a respective transistor T9' and T10' and a resistor R9' and R10'. Base terminals of the transistors T9' and T10' are connected to a first reference voltage potential Vref1. Base terminals of the transistors T5' and T6' are each connected to a collector terminal of a respective transistor T11' and T12' and are also each connected to the ground potential terminal GND through a series circuit of a respective diode T13' or T14' and a respective resistor R11' or R12'. Emitter terminals of the transistors T11' and T12' are connected through a series circuit of a collector-to-emitter path of a transistor T15' and a resistor R13' to the supply voltage potential VCC. A base terminal of the transistor T15' is connected to a second reference voltage potential Vref2. Base terminals of the transistors T11' and T12' are each connected to one respective control terminal INST1 and INST2. One of the differential amplifiers can be selected and activated through the transistors T13' and T14', so that its input signals are switched through to the output of the multiplexer. In the case of the multiplexer as well, all of the resistors have a negative temperature coefficient and have a temperature-stabilizing effect on the transmission properties of the multiplexer, with the reference voltages Vref1 and Vref2.

Figure 5:
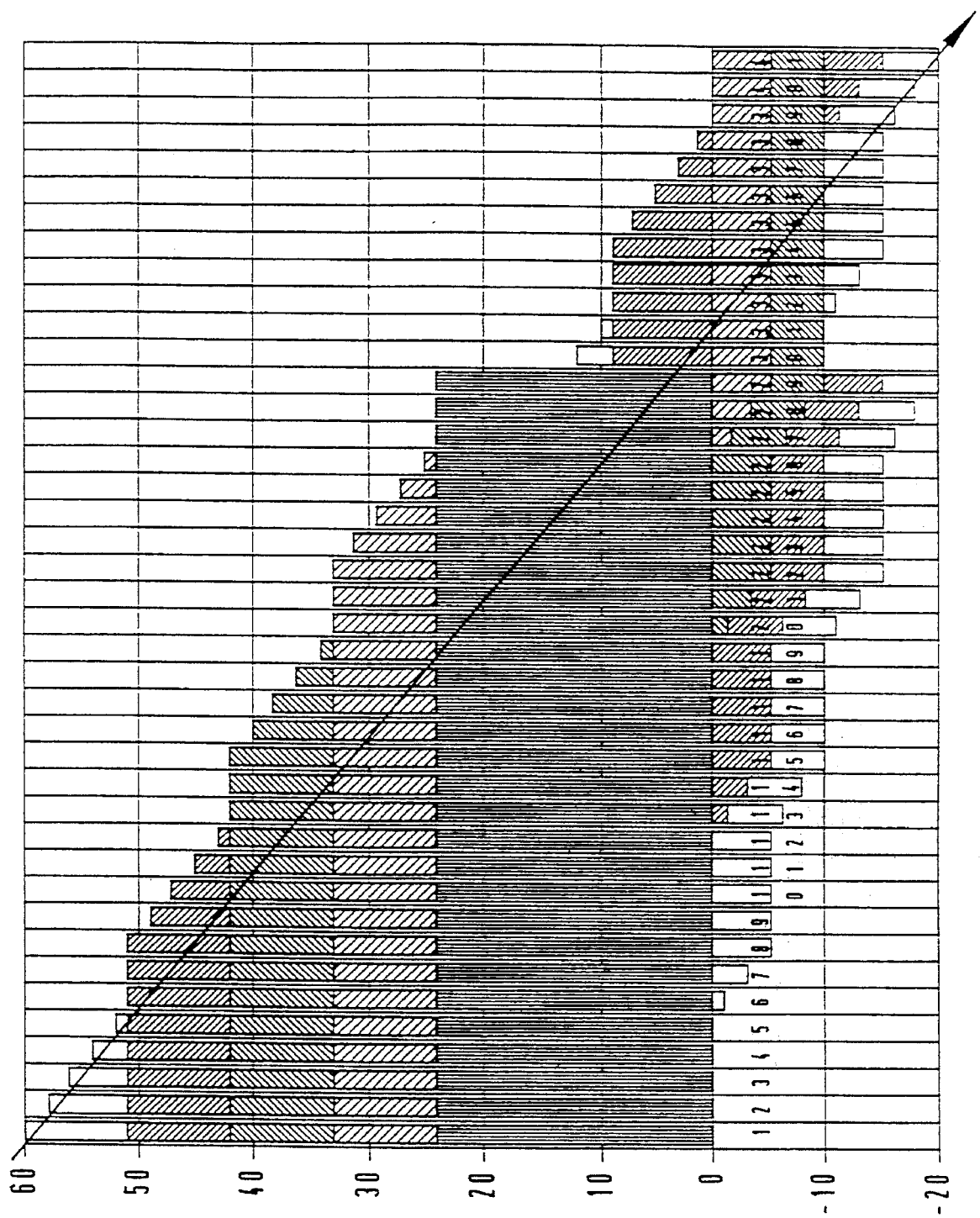
FIG. 5 is a diagram that illustrates adjustment possibilities of the amplifier array according to the invention.

In FIG. 5, the gain of an amplifier array of FIG. 1 is shown as a function of the gain adjustments of the individual amplifiers of the various switching amplifiers and of the selected gain path or input amplifier. The individual amplifiers have a gain of 24 dB or 0 dB, and the switching amplifiers each have a gain ranging from −5 dB to 9 dB in increments of 2 dB. The various shaded regions each show the adjusted gain of one switching amplifier. It can be seen clearly from FIG. 5 that only one switching amplifier ever needs to be switched by one step in order to obtain a linear course of the total gain. The only exception to this rule is the switchover from one individual amplifier to the next or from one gain path to the next. Then as well, one individual amplifier at a time of the last and next-to-last switching amplifier is switched one more time. However, since this takes place at the same time as the switchover of the gain path, it has no disadvantageous effect on the linearity.

Figure 6:
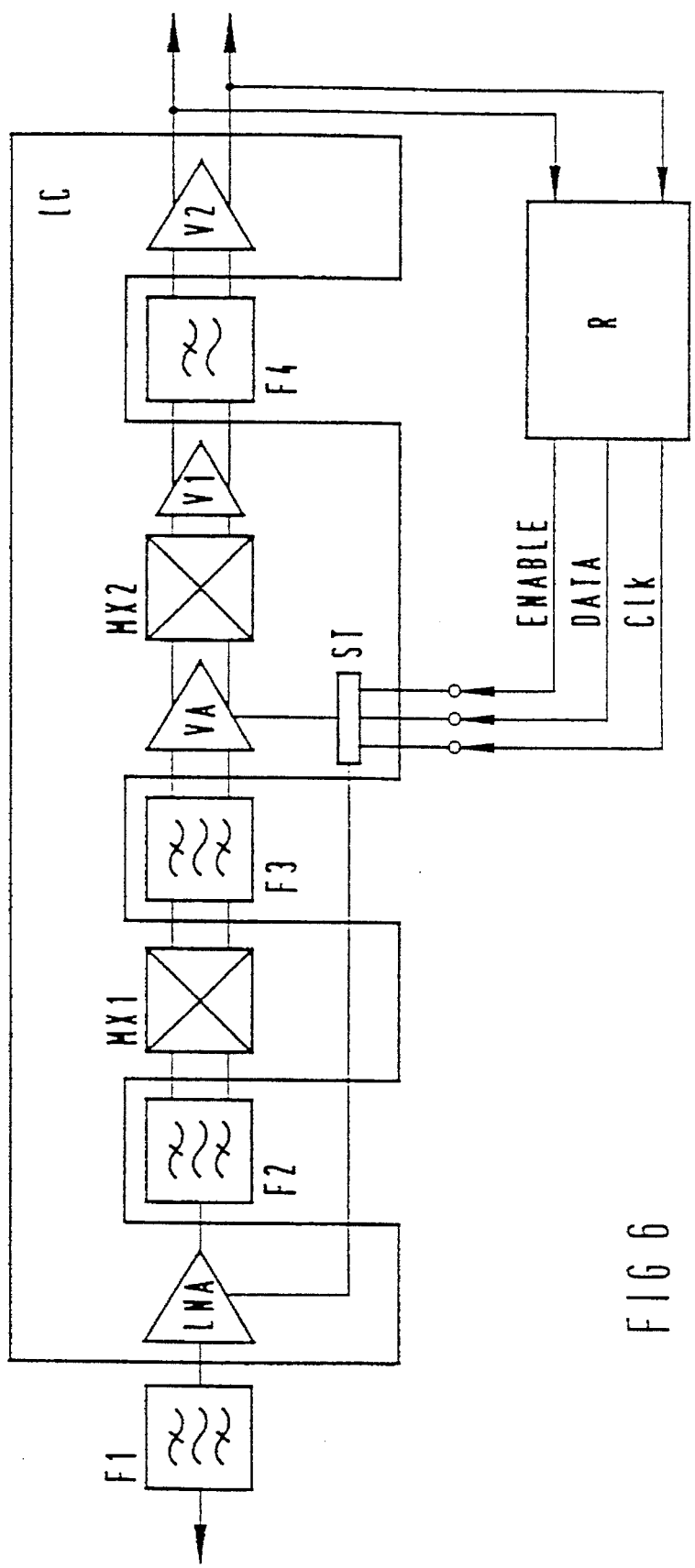
FIG. 6 is a block circuit diagram of a receiver circuit according to the invention, having an amplifier array according to the invention.

FIG. 6 shows a block circuit diagram of a receiver circuit of the kind which is used, for instance, in a mobile radio handset and is already described in the introductory portion of this specification. It can be seen that all amplifiers VA, V1, V2 and mixers MX1, MX2 as well as the control circuit ST for the amplifier array according to the invention are integrated on a single chip IC. Only filters F1–F4 have to be added externally. A switchable preamplifier LNA can be triggered by the control circuit ST as well. As a result, the dynamic range of the receiving circuit can be expanded. Only three terminals on the integrated component forming the receiver are required for switching the amplifier array, that is the intermediate-frequency amplifier. As a result, the IC can be connected over a three-conductor bus system with the other components which are required to regulate the level of the receiver output signal.

We claim:

1. An amplifier array having digitally adjustable total gain and being constructed of a multiplicity of switchable individual amplifiers, comprising:

at least two parallel, selectively triggerable gain paths having input and output sides;

each of said gain paths having an input amplifier and a switching amplifier being connected downstream of said input amplifier and being switchable in stages;

a multiplexer having inputs connected to said output side of said gain paths and having an output; and an amplifier array input connected to said input side of said gain paths and an amplifier array output being formed by said output of said multiplexer;

wherein said input amplifier are base-coupled amplifiers.

2. The amplifier array according to claim 1, wherein said input amplifiers are switchable, and a selection of one of said gain paths is made by a selection of one of said an input amplifiers.

3. An amplifier array having digitally adjustable total gain and being constructed of a multiplicity of switchable individual amplifiers, comprising:

at least two parallel, selectively triggerable gain paths having input and output sides;

each of said gain paths having an input amplifier and a switching amplifier being connected downstream of said input amplifier and being switchable in stages;

a multiplexer having inputs connected to said output side of said gain paths and having an output; and an amplifier array input connected to said input side of said gain paths and an amplifier array output being formed by said output of said multiplexer, wherein said switching amplifiers are emitter-coupled amplifiers.

4. The amplifier array according to claim 1, including at least one further switching amplifier connected downstream of said multiplexer.

5. An amplifier array having digitally adjustable total gain and being constructed of a multiplicity of switchable individual amplifiers, comprising:

at least two parallel, selectively triggerable gain paths having input and output sides;

each of said gain paths having an input amplifier and a switching amplifier being connected downstream of said input amplifier and being switchable in stages;

a multiplexer having inputs connected to said output side of said gain paths and having an output; and an amplifier array input connected to said input side of said gain paths and an amplifier array output being formed by said output of said multiplexer, including at least one further switching amplifier connected downstream of said multiplexer, wherein at least one of said at least one further switching amplifier is capacitively coupled to said multiplexer or a further switching amplifier.

6. An amplifier array having digitally adjustable total gain and being constructed of a multiplicity of switchable individual amplifiers, comprising:

at least two parallel, selectively triggerable gain paths having input and output sides;

each of said gain paths having an input amplifier and a switching amplifier being connected downstream of said input amplifier and being switchable in stages;

a multiplexer having inputs connected to said output side of said gain paths and having an output; and an amplifier array input connected to said input side of said gain paths and an amplifier array output being formed by said output of said multiplexer, wherein said switching amplifiers are formed with n parallel-connected, selectively actuatable amplifiers having variable gains, and the gains each differ by the same factor from the gain of any other of said amplifiers in the same one of said switching amplifiers.

7. An amplifier array having digitally adjustable total gain and being constructed of a multiplicity of switchable individual amplifiers, comprising:

at least two parallel, selectively triggerable gain paths having input and output sides;

each of said gain paths having an input amplifier and a switching amplifier being connected downstream of said input amplifier and being switchable in stages;

a multiplexer having inputs connected to said output side of said gain paths and having an output; and an amplifier array input connected to said input side of said gain paths and an amplifier array output being formed by said output of said multiplexer, wherein all of said amplifiers are differential amplifiers.

8. The amplifier array according to claim 1, wherein said individual amplifiers are interconnected to produce a linear gain.

9. The amplifier array according to claim 1, including a control circuit triggering said individual amplifiers.

10. The amplifier array according to claim 9, including a three-conductor bus with which said control circuit is triggered.

11. An amplifier array having digitally adjustable total gain and being constructed of a multiplicity of switchable individual amplifiers, comprising:

at least two parallel, selectively triggerable gain paths having input and output sides;

each of said gain paths having an input amplifier and a switching amplifier being connected downstream of said input amplifier and being switchable in stages;

a multiplexer having inputs connected to said output side of said gain paths and having an output; and an amplifier array input connected to said input side of said gain paths and an amplifier array output being formed by said output of said multiplexer, wherein said amplifiers receive a reference current through operating point currents for making a total gain virtually independent of temperature.

12. A mobile radio receiver, comprising:

an amplifier array having digitally adjustable total gain, being constructed of a multiplicity of switchable individual amplifiers, and including:

at least two parallel, selectively triggerable gain paths having input and output sides;

each of said gain paths having an input amplifier and a switching amplifier being connected downstream of said input amplifier and being switchable in stages;

a multiplexer having inputs connected to said output side of said gain paths and having an output; and an amplifier array input connected to said input side of said gain paths and an amplifier array output being formed by said output of said multiplexer;

an adjuster for a total gain of said amplifier array setting an output signal of the mobile radio receiver at a constant level; and a preamplifier being triggerable and adjustable by said total gain adjuster.

13. The mobile radio receiver according to claim 12, including a three-conductor bus for triggering said total gain adjuster.

* * * * *